(12) United States Patent
McClellan et al.

(10) Patent No.: US 10,635,389 B2
(45) Date of Patent: Apr. 28, 2020

(54) SYSTEMS AND METHODS FOR AUTOMATICALLY GENERATING ENHANCED AUDIO OUTPUT

(71) Applicant: iZotope, Inc., Cambridge, MA (US)

(72) Inventors: James McClellan, Cambridge, MA (US); Gordon Wichern, Roslindale, MA (US); Aaron Wishnick, Brooklyn, NY (US); Alexey Lukin, Somerville, MA (US); Matthew Hines, Brookline, MA (US)

(73) Assignee: iZotope, Inc., Cambridge, MA (US)

( * ) Notice: Subject to any disclaimer, the term of this patent is extended or adjusted under 35 U.S.C. 154(b) by 0 days.

(21) Appl. No.: 16/137,901

(22) Filed: Sep. 21, 2018

(65) Prior Publication Data

US 2019/0018645 A1 Jan. 17, 2019

Related U.S. Application Data

(63) Continuation of application No. PCT/US2018/034340, filed on May 24, 2018.

(Continued)

(51) Int. Cl.
 *G06F 3/16* (2006.01)
 *H03G 9/02* (2006.01)
 (Continued)

(52) U.S. Cl.
 CPC ............ *G06F 3/165* (2013.01); *H03G 5/005* (2013.01); *H03G 5/165* (2013.01); *H03G 9/005* (2013.01); *H03G 9/025* (2013.01)

(58) Field of Classification Search
 CPC ......... G06F 3/16; G06F 3/165; G11B 27/031; H03G 5/165; H03G 5/005; H03G 9/005; H03G 9/025

(Continued)

(56) References Cited

U.S. PATENT DOCUMENTS

2009/0037179 A1  2/2009  Liu et al.
2014/0140536 A1  5/2014  Serletic, II et al.
(Continued)

OTHER PUBLICATIONS

International Search Report and Written Opinion dated Aug. 10, 2018 in connection with International Application No. PCT/US2018/034340.

(Continued)

*Primary Examiner* — Walter F Briney, III
(74) *Attorney, Agent, or Firm* — Wolf, Greenfield & Sacks, P.C.

(57) ABSTRACT

Some embodiments of the invention are directed to enabling a user to modify the manner in which one or more settings specified by a predefined template for a particular sound source are applied, so as to provide the user with greater control over the settings which are applied to a track than conventional tools afford. Some embodiments are directed to automatically applying one or more settings for a track based at least in part upon an analysis of the spectral and/or dynamic content of the track, such as by automatically performing sound equalization by applying one or more digital filters to a track, defining the frequency range(s) in which one or more filter(s) are applied, applying dynamic range compression, defining the manner in which compression is applied in multiple sub-bands of the audible spectrum, and/or applying one or more other settings. Such settings may be designed to achieve any of numerous (e.g., artistic) goals, such as to bring to the forefront certain elements of the natural character of the sound in a track, or to enhance the track's overall balance and/or clarity.

28 Claims, 8 Drawing Sheets

Related U.S. Application Data (60) Provisional application No. 62/516,605, filed on Jun. 7, 2017.

(51) Int. Cl.
*H03G 9/00* (2006.01)
*H03G 5/00* (2006.01)
*H03G 5/16* (2006.01)

(58) Field of Classification Search
USPC ........ 700/94; 381/56, 57, 58, 119, 104, 106, 381/107, 98–103
See application file for complete search history.

(56) References Cited

U.S. PATENT DOCUMENTS

| | | |
|---|---|---|
| 2015/0117685 A1 | 4/2015 | Reiss et al. |
| 2016/0371051 A1* | 12/2016 | Rowe .................... H04H 60/04 |

OTHER PUBLICATIONS

International Preliminary Report on Patentability dated Dec. 19, 2019 in connection with International Application No. PCT/US2018/034340.

PCT/US2018/034340, dated Dec. 19, 2019, International Preliminary Report on Patentability.

* cited by examiner

SYSTEMS AND METHODS FOR AUTOMATICALLY GENERATING ENHANCED AUDIO OUTPUT

RELATED APPLICATIONS

This application is a continuation of commonly assigned International Patent Application No. PCT/US2018/034340, filed May 24, 2018, entitled "Systems and Methods for Automatically Generating Enhanced Audio Output," which claims priority to commonly assigned U.S. Provisional Application Ser. No. 62/516,605, filed Jun. 7, 2017, entitled "Systems and Methods for Automatically Generating Enhanced Audio Output." The entirety of each of the documents listed above is incorporated herein by reference.

BACKGROUND INFORMATION

Audio production tools exist that enable users to produce high-quality audio. For example, some audio production tools enable users to record sound produced by one or more sound sources (e.g., vocals and/or speech captured by a microphone, music played with an instrument, etc.), process the audio (e.g., to master, mix, design, and/or otherwise manipulate the audio), and/or control its playback. Audio production tools may be used to produce audio comprising music, speech, sound effects, and/or other sounds.

Some computer-implemented audio production tools provide a graphical user interface with which users may complete various production tasks on an audio recording. For example, some tools may receive audio input and generate one or more digital representations of the input, which a user may manipulate using the graphical user interface to obtain audio output having desired characteristics.

A user may employ an audio production tool to perform any of numerous production tasks. For example, many audio production tools enable a user to perform sound equalization, which is a technique used to alter a sound recording by applying filters to sound in one or more frequency ranges, so as to boost or attenuate spectral portions of a recording. Many audio production tools also enable users to perform sound compression, which is a technique for attenuating loud sounds so that other sounds are more easily perceived by a listener.

BRIEF DESCRIPTION OF DRAWINGS

Various aspects and embodiments of the invention are described below with reference to the following figures. It should be appreciated that the figures are not necessarily drawn to scale. Items appearing in multiple figures are indicated by the same reference number in all the figures in which they appear.

DETAILED DESCRIPTION

I. Overview

Some conventional audio production tools are capable of automatically recognizing the source of sound included in an audio track. For example, techniques are known for automatically recognizing whether the sound included in a track was produced by a particular instrument, by vocals, and/or by one or more other sources.

Some conventional audio production tools may also be capable of applying a predefined "template" of audio production settings based upon a recognized sound source. These settings may, for example, define sound equalization parameters (e.g., the application of one or more digital filters to boost or attenuate sound in certain frequency ranges) to produce audio output which is generally considered to be pleasing to a listener. For example, some conventional audio production tools may apply one collection of settings to a track that is recognized as including sound produced by a guitar, another collection of settings to a track recognized as including sound produced by drums, another collection of settings to a track that is recognized as including sound produced by vocals, and so forth.

The Assignee has recognized that a user may have any of numerous goals for a track that includes sound from a particular source, and that the settings defined by a "one size fits all" predefined template may not serve those goals. For example, a user may wish to achieve a particular mood, sound quality and/or other characteristic for a guitar track that one or more settings in a predefined guitar template does not allow the user to achieve. As such, some embodiments of the invention may enable a user to modify the manner in which one or more settings specified by a predefined template for a particular sound source are applied. For example, some embodiments may enable a user to specify that the amplitude at which one or more digital filters specified by a predefined template is applied is varied, by selecting a "preset" for the template. Further, some embodiments may enable the user to define the extent to which the amplitude for one or more digital filters is varied, by selecting a "mode" for a preset. As a result, the user may have greater control over the settings which are applied to a track than conventional audio production tools afford. The user may therefore benefit from the time savings that come with having access to a collection of predefined settings for a particular sound source, without being restricted to a "one size fits all" scheme for the sound source.

Additionally, some embodiments of the invention may allow the user to switch from using one collection of settings (e.g., defined by a predefined template, as modified per the user's selection of a preset and/or mode) to another, so that he/she may "try out" different settings before deciding on a particular collection that allows him/her to achieve the goals he/she has in mind for a track.

The Assignee has also recognized that many users may expend significant time and effort defining settings for a track, regardless of whether a predefined template of settings is applied. Some embodiments of the invention are directed to reducing the amount of time and effort a user expends, and/or enabling the user to produce higher quality music than he/she may have been capable of producing on his/her own. For example, some embodiments may automatically determine one or more settings for a track based at least in part upon an analysis of the spectral and/or dynamic content of the track. The settings which are automatically determined may take any of numerous forms. For example, some embodiments may automatically perform sound equalization by applying one or more digital filters to a track, and/or defining the frequency range(s) in which the filter(s) are applied. Some embodiments may automatically apply dynamic range compression to a track, so as to attenuate loud sounds in the track, without diminishing the track's overall character. Some embodiments may automatically define the manner in which compression is applied in multiple sub-bands of the audible spectrum, such as by intelligently positioning "cross-overs" between the sub-bands so as to promote overall sound quality. Any suitable setting(s) may be automatically determined based at least in part upon the spectral content of a track, as the invention is not limited in this respect.

The settings for a track may be automatically determined in any suitable way. For example, one or more heuristics, algorithms, and/or other processing technique(s) may be used to determine how various spectral characteristics of a track may influence the settings for the track. In this respect, settings may be automatically determined to a track so as to achieve any of numerous (e.g., artistic) goals. For example, some embodiments may automatically determine certain settings to bring to the forefront certain elements of the natural character of the sound in a track, to enhance the track's overall balance and/or clarity, and/or achieve any of numerous other objectives.

Although automatically determining the settings for a track may save the user considerable time and effort, and/or enable him/her to produce sound of a quality which he/she may not otherwise have been capable of producing, the Assignee has recognized that audio production is ultimately a creative endeavor by which a user may seek to express his/her own unique "voice." Thus, some embodiments of the invention may enable a user to modify any of the settings which are automatically applied to a track. As such, some embodiments of the invention may enable the user to reap the benefits of increased audio production efficiency and/or enhanced audio quality, to the extent he/she deems appropriate, while still producing audio output that suits his/her unique tastes and objectives.

II. Automatically Generating Enhanced Audio

Figure 1:
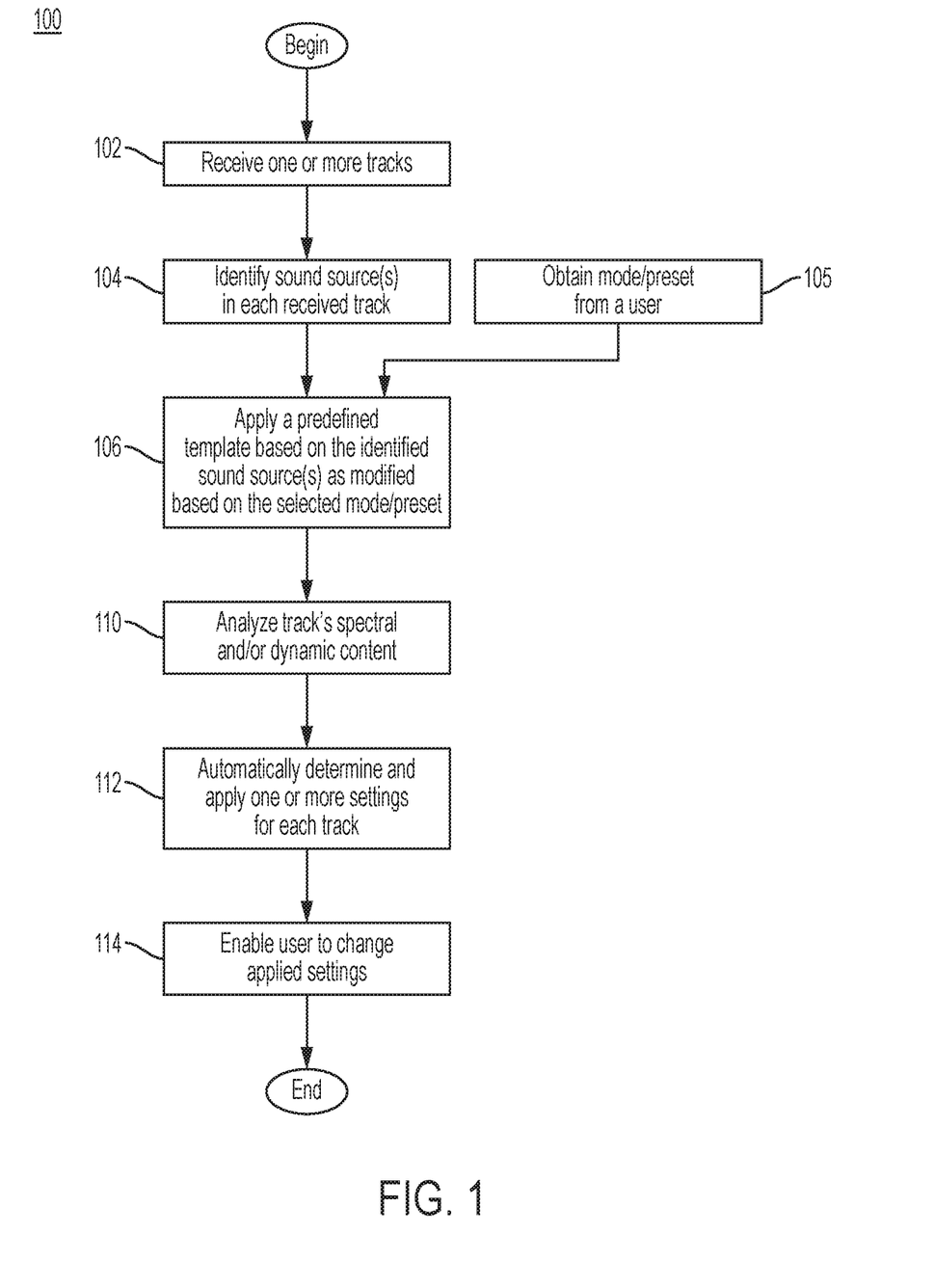
FIG. 1 is a flowchart illustrating a representative audio production process, in accordance with some embodiments of the invention.

FIG. 1 depicts a representative process 100 for automatically generating enhanced audio. In some embodiments, representative process 100 may be performed via execution of software, by a system which includes an audio recording system, digital audio workstation, personal computer, and/or portable device (e.g., a tablet, smartphone, gaming console, and/or other suitable portable device) that presents a graphical user interface which a user may employ to invoke certain functions. However, it should be appreciated that representative process 100 is not limited to being performed via execution of software, by any particular component(s), and that embodiments of the invention may be implemented using any suitable combination of hardware and/or software.

Representative process 100 begins at act 102, wherein one or more tracks are received. Each track received in act 102 may, for example, include sound which is produced by a particular sound source, such as a musical instrument, microphone, computer system, and/or any other suitable source(s). Of course, a track need not include only sound from a single source, as any suitable number of sound sources may be represented in a particular track. If act 102 comprises receiving multiple tracks, then the tracks may collectively form a multi-track recording. In some embodiments, each track received in act 102 may comprise a digital representation of a time-delimited audio recording. As such, act 102 may comprise storing each track in computer-readable memory.

In act 104, each track received in act 102 is analyzed to identify the sound source(s) represented in the track. Those skilled in the art will recognize that any of numerous techniques, whether now known or later developed, may be used to identify the sound source(s) represented in a track. These identification techniques are not considered by the Assignee to be a part of the invention, and so they will not be described in further detail here.

In act 106, a predefined template of settings is selected for each track received in act 102, based at least in part on the sound source(s) identified in act 104. In representative process 100, the settings which are specified by the selected predefined template may be varied based upon the user's selection of a "preset" and "mode" (described in further detail below), which are received in act 105. In representative process 100, acts 104 and 105 may occur concurrently or at different times.

Figure 2A:
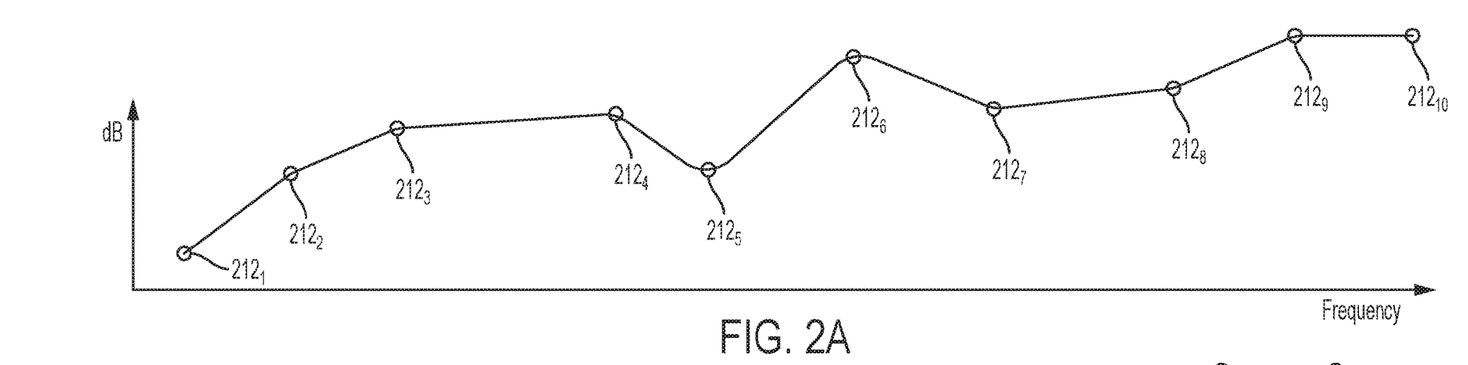
FIGS. 2A-2C are plots depicting representative predefined templates, in accordance with some embodiments of the invention.
Figure 2B:
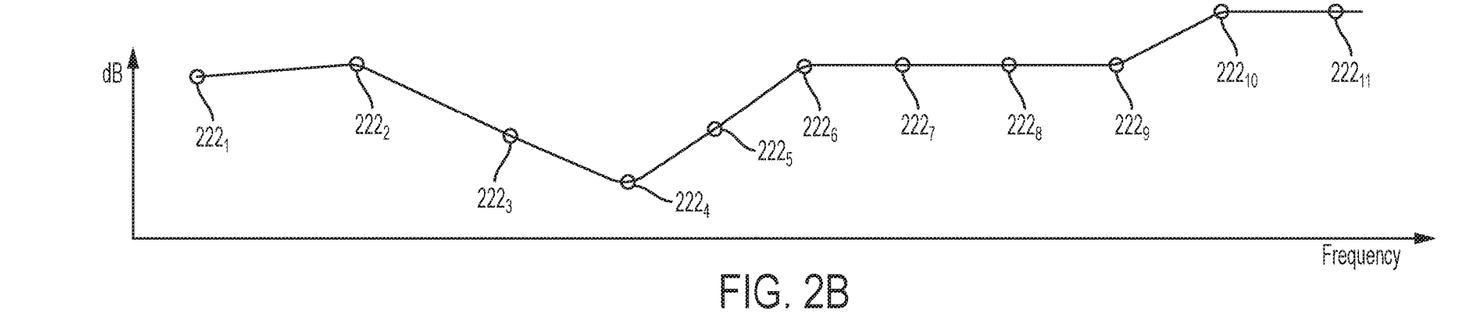
Figure 2C:
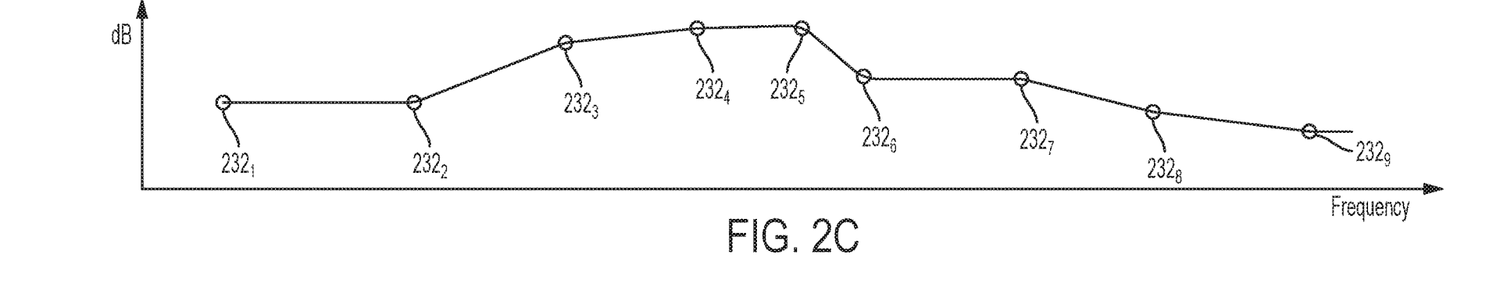

To illustrate the manner in which one or more settings specified by a predefined template may be modified based upon the user's selection of a preset and mode, three representative predefined templates are symbolically depicted in FIGS. 2A-2C. Specifically, each of FIGS. 2A-2C shows a two-dimensional plot in which frequency is represented on the x-axis and amplitude is represented on the y-axis. Each plot shows a series of nodes, with the placement of each node indicating the frequency and amplitude of a corresponding digital filter. The various nodes may therefore be considered the settings of a digital equalizer. FIG. 2A depicts a collection of equalizer settings predefined for a first sound source (i.e., nodes $212_1$, $212_2$, $212_3$, $212_4$, $212_5$, $212_6$, $212_7$, $212_8$, $212_9$, and $212_{10}$), FIG. 2B depicts a collection of settings predefined for a second sound source (i.e., nodes $222_1$, $222_2$, $222_3$, $222_4$, $222_5$, $222_6$, $222_7$, $222_8$, $222_9$, $222_{10}$, and $222_{11}$), and FIG. 2C depicts a collection of settings predefined for a third sound source (i.e., nodes $232_1$, $232_2$, $232_3$, $232_4$, $232_5$, $232_6$, $232_7$, $232_8$, and $232_9$). It should be appreciated that although three representative predefined templates are shown in FIGS. 2A-2C, any suitable number of predefined templates may be used to process audio input. It should also be appreciated that a predefined template is not limited to having the same number of settings as any of those shown, as a predefined template may include any suitable number of settings.

In the examples shown, the template represented in FIG. 2A for the first sound source boosts high frequencies and cuts low frequencies, the template represented in FIG. 2B for the second sound source boosts high frequencies and cuts some middle frequencies, and the template shown in FIG. 2C for the third sound source boosts some middle frequencies and cuts high frequencies. Of course, a template that is predefined for a particular sound source may include settings that are designed to achieve any suitable frequency response.

It can be seen in FIGS. 2A-2C that the line segments extending between the nodes in each template create a "shape" for the template.

Some embodiments of the invention enable a user to modify the frequency response associated with a predefined template by specifying a "preset" which varies the amplitude at which one or more of the filters shown in FIGS. 2A-2C is applied. A preset may be established so as to modify a given predefined template in any suitable way. As an example, some embodiments may allow the user to select a "broadband clarity" preset to enhance sound clarity across the entire audible spectrum, a "warm and open" preset to make low frequencies more pronounced, an "upfront midrange" preset to make certain midrange frequencies more pronounced, and/or any other suitable preset. Any suitable number of presets may be made available to a user.

It should be appreciated that the manner in which a particular preset alters the frequency response of one predefined template may be different than the way that the same preset alters the frequency response of another predefined template. For example, selecting a "warm and open" preset may cause the amplitude at which three digital filters shown in FIG. 2A to be modified, but may cause the amplitude at which five digital filters shown in FIG. 2B to be modified. A preset may vary a given predefined template in any suitable fashion.

Some embodiments of the invention may also enable the user to select a mode. A mode may define the extent to which a selected preset varies the amplitude at which one or more digital filters is applied. For example, some embodiments allow the user to select a "subtle" mode in which the amplitudes of one or more of the digital filters defined by a template are increased or decreased by no more than a first amount (e.g., 0.5 dB), a "medium" mode wherein the amplitudes of one or more of the digital filters are increased or decreased by no more than a second amount which is larger than the first amount (e.g., 2 dB), and an "aggressive" mode wherein the amplitudes of one or more of the digital filters in a template are increased or decreased by an amount that exceeds the second amount. Of course, any suitable number of modes may be defined, and each mode may be designed to achieve any suitable variation on the amplitude at which one or more digital filters is applied.

Figure 3:
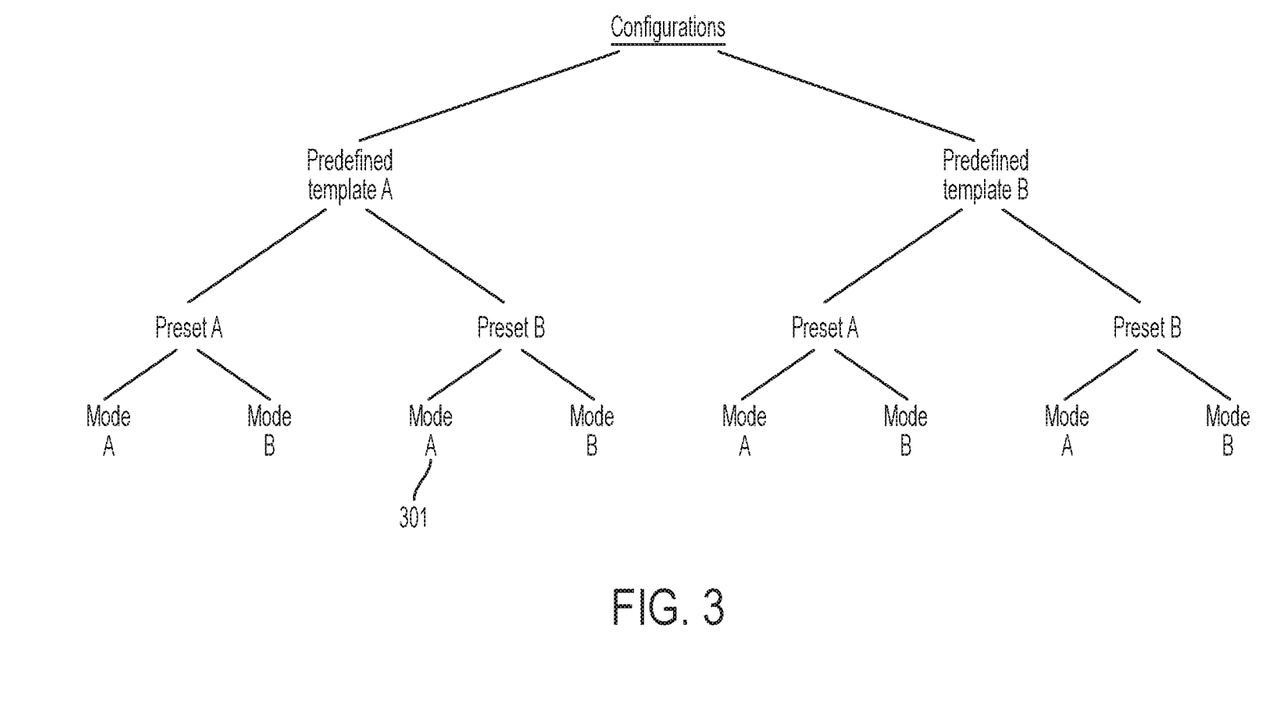
FIG. 3 is a tree diagram depicting a representative hierarchy of predefined templates, presets and modes, according to some embodiments of the invention.

A representative scheme 300 of predefined templates, presets and modes is shown in FIG. 3. In representative scheme 300, predefined templates, presets and modes are arranged in a hierarchy, with predefined templates at the highest level in the hierarchy, followed by presets and modes at successively lower levels in the hierarchy. For each predefined template, there may be one or more presets, and for each preset there may be one or more modes. Thus, in representative scheme 300, there are two predefined templates A and B, each corresponding to a particular sound source. For each predefined template there are two presets A and B. For each preset there are two modes A and B. Of course, any suitable number of predefined templates, presets, and/or modes may be employed. Some templates may have a different number and type of associated presets than other templates, and some presets may have a different number and type of associated modes than other presets. In some embodiments, templates, presets and modes may not be arranged in a hierarchy. If arranged in a hierarchy, the hierarchy may include any suitable number of levels.

Referring again to FIG. 1, act 106 (FIG. 1) involves selecting, for each track received in act 102, a predefined template based upon the sound source(s) identified for the track in act 104, as modified based upon a user's selection of a preset and/or mode received in act 105. As an illustrative example, if the result of act 104 is the identification of a sound source which is associated with predefined template A shown in FIG. 3, and act 105 involves receiving a user's selection of a preset B and mode A, then act 106 may involve applying the template/preset/mode combination shown at 301 in FIG. 3.

It should be appreciated that the settings associated with a predefined template, preset or mode need not be static, or uniform across all users. For example, a predefined template may include settings which are established to suit the preferences of a particular user, which may vary over time. These preferences may be determined by gathering information on how the user commonly applies filters to tracks that include particular sound sources over time. A predefined template may also, or alternatively, include settings which are established to suit the preferences of multiple users, which may also vary over time. These preferences may be determined by gathering information on how the users apply filters over time to tracks that include particular sound sources. Similarly, information on how one or more users applies a particular preset and/or mode may cause the manner in which a preset and/or mode modifies a setting specified by a template to vary over time. Modifying a template, preset and/or mode over time may be accomplished in any suitable fashion. For example, one or more machine learning algorithms may process information on preferences exhibited by one or more users over time to determine the ways in which a template, preset or mode are to be modified.

At the completion of act 106, representative process 100 proceeds to act 110, wherein the spectral and/or dynamic (time-domain) content of each track received in act 102 is automatically analyzed. The spectral and/or dynamic content of a track may be automatically analyzed in any of numerous ways, to identify any of numerous spectral and/or dynamic characteristics. For example, act 110 may involve executing software which takes as input a digital representation of a track, and applies one or more encoded algorithms to identify characteristics such as the frequency range(s) in which a track exceeds a particular threshold power level, a relationship between the power density in one frequency range and the power density in another frequency range, the frequency range(s) in which the power density is below a certain threshold, the presence and/or amplitude of peaks, and/or identify any of numerous other spectral characteristics of a track.

In act 112, one or more settings are automatically determined for each track and applied, based at least in part upon the spectral and/or dynamic characteristics of the track. The settings which are determined and applied in act 112 may be designed to achieve any of numerous objectives, such as enhancing certain characteristics of the sound in the track, making one or more sounds in the track more or less pronounced, enhancing the track's balance and/or clarity, etc. Various processing techniques may be used to achieve these objectives, including but not limited to sound equalization, single-band compression, multi-band compression, limiting and panning. Some representative techniques for automatically determining and applying the settings for a track are described in more detail in the sections that follow.

Example 1: Automatically Performing Sound Equalization

Figure 4A:
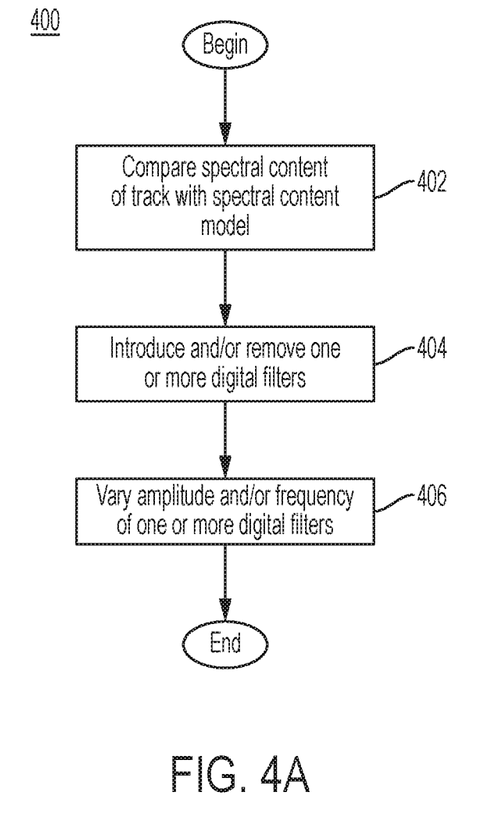
FIG. 4A is a flowchart depicting a representative process for automatically equalizing sound in an audio recording, according to some embodiments of the invention.

In some embodiments of the invention, act 112 may involve automatically performing sound equalization for a track. A representative process 400 for performing automatic sound equalization is shown in FIG. 4A. Representative process 400 begins in act 402, wherein the track's spectral content (i.e., identified in act 110 (FIG. 1)) is compared to a spectral content model for the sound source(s) in the track, to determine the ways in which the track's spectral content varies from the model. Any suitable spectral content model may be used, and a spectral content model may be defined in any suitable way.

In some embodiments, the shape associated with the predefined template identified in act 106 for the sound source(s) included in the track may be used as a spectral content model. In this respect, it should be appreciated that although the predefined template was applied to the track in act 106, and the predefined template may include digital filters applied in corresponding frequency ranges, so that the track should conform to some extent to the shape associated with the predefined template at the completion of act 106, the predefined template may not include digital filters for all of the frequency ranges in which sound is present in the track. To illustrate, consider the predefined template shown in FIG. 2C, which includes filters designed to boost some middle frequencies and cut high frequencies. A particular track may include sound in a frequency range in which the predefined template does not include a digital filter, such as sound in the low frequencies. As a result, although the predefined template was applied to the track in act 106, the spectral content of the track may not fully conform to the shape associated with the predefined template.

Of course, it should be appreciated that the invention is not limited to employing a predefined template as the spectral content model in act 402. Any suitable spectral content model(s) may be compared with a track's spectral content in act 402.

Figure 4B:
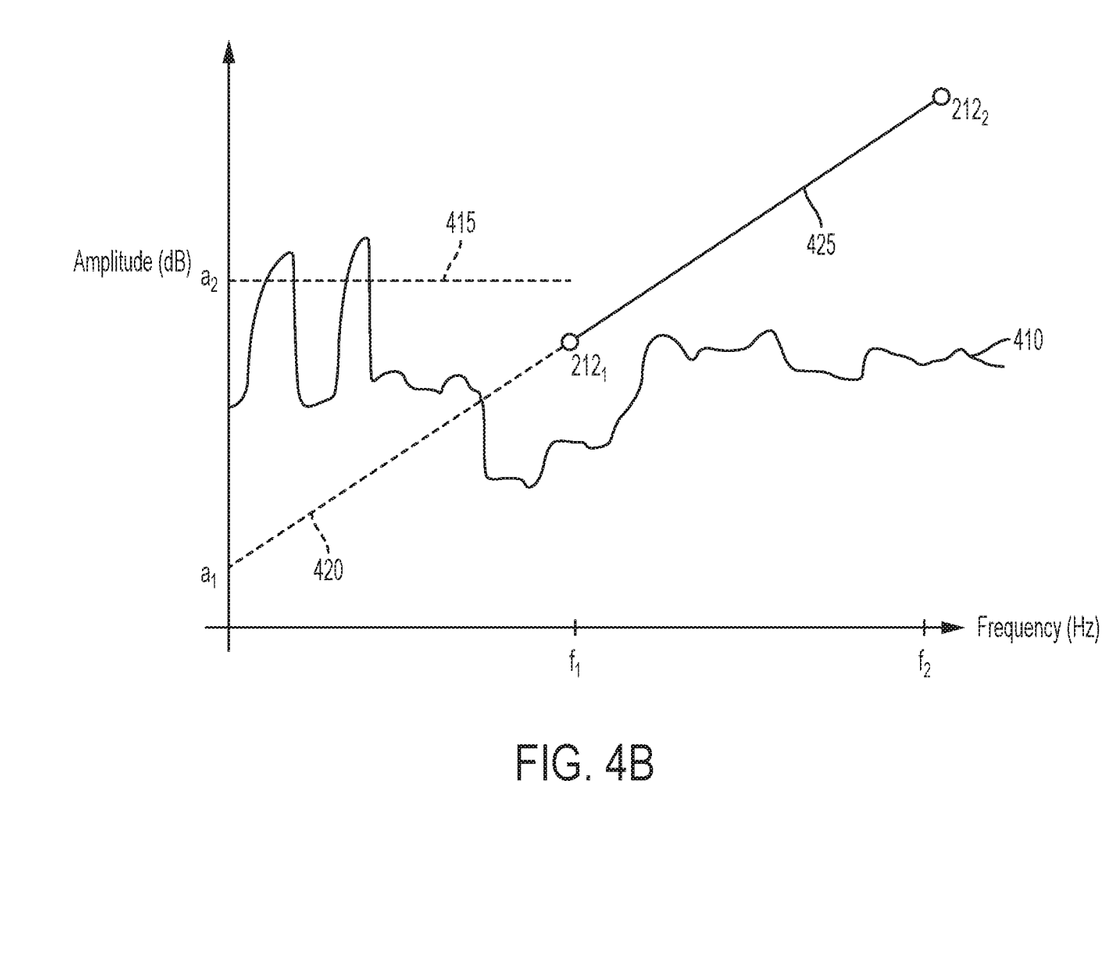
FIG. 4B is a plot depicting representative output of audio equalization, according to some embodiments of the invention.

In representative process 400, the result of the comparison in act 402 is an identification of one or more frequency ranges in which the track's spectral content varies from the model, and the manner and extent to which the content varies from the model In act 404, then, one or more digital filters is applied in the identified frequency range(s), so as to reduce or eliminate this variance. An illustrative example is shown in FIG. 4B. Specifically, FIG. 4B depicts a portion of the predefined template shown in FIG. 2A, in a frequency range which extends from a frequency lower than $f_1$ at which node 212$_1$ is placed to $f_2$, at which node 212$_2$ is placed. Line segment 425 extends between nodes 212$_1$ and 212$_2$, and thus comprises a portion of the "shape" of the predefined template shown in FIG. 4A. As no node is placed at a frequency lower than $f_1$ in the predefined template shown in FIG. 4A, no shape is explicitly formed at frequencies lower than $f_1$. Dotted line segment 420 depicts where the shape may be located at frequencies lower than $f_1$ if line segment 425 continued along the same path as between $f_1$ and $f_2$. It can be seen that dotted line segment 420 crosses the y-axis at amplitude $a_2$.

FIG. 4B also depicts the spectral content of a representative track 410 in the frequency range shown. A threshold 415 resides at frequencies less than or equal to $f_1$, at amplitude $a_2$. It can be seen in FIG. 4B that the power of the track at frequencies lower than $f_1$ exceeds threshold 415. As a result, act 404 may include placing one or more additional digital filters (not shown in FIG. 4B) at frequencies lower than $f_1$. As an example, one or more digital filters may each be placed at a frequency lower than $f_1$ at an amplitude which approximates $a_2$, at an amplitude at which dotted line segment 420 intersects the frequency, and/or at any other suitable amplitude. Any suitable number of digital filters may be applied at any suitable amplitude and frequency, as the invention is not limited in this respect.

Referring again to FIG. 4A, at the completion of act 404, representative process 400 proceeds to act 406, wherein the amplitude and/or frequency at which one or more digital filters is applied to the track is modified. Act 406 may involve modifying the amplitude and/or frequency of a digital filter applied in act 404, and/or modifying the amplitude and/or frequency of a digital filter applied as part of a predefined template in act 106 (FIG. 1). This modification may, for example, be based upon predefined heuristics or rules, be based upon information which is dynamically determined (e.g., the spectral content of the track), and/or defined in any other suitable way.

As an example, a predefined heuristic may provide an optimal ratio between the bandwidth in which "boost" filters are applied and the bandwidth in which "cut" filters are applied. As a result, act 406 may involve modifying the bandwidths in which "boost" and "cut" filters are applied so that the optimal ratio is achieved. The extent to which any one or more bandwidths in which filters are applied to achieve the optimal ratio may be defined based at least in part on the spectral content of the track, the sound source(s) included in the track, and/or any other suitable characteristic(s) of the track.

As another example, a predefined heuristic may provide that a track with excessive content in the high frequencies sounds too "cold." Thus, if a track includes an amount of spectral content in the high frequencies which exceeds a predefined threshold, then act 406 may involve modifying the frequency and/or amplitude at which one or more digital filters is applied, so as to make the track sound "warmer" by making spectral content in the middle and/or lower frequencies more prominent. It should be appreciated that the frequencies which constitute "high" frequencies, and the threshold defining whether an amount of content in those frequencies is excessive, may each be defined in any suitable fashion.

As another example, a predefined heuristic may provide for modifying the frequency and/or amplitude of one or more digital filters based upon a particular sound system which is to be used to reproduce the track, the environment in which the track is to be reproduced, and/or any other suitable information. For example, if a particular loudspeaker tends to suppress the low frequencies when used in a particular setting, one or more digital filters may be modified so as to boost the content of a track in the low frequencies and/or suppress the content in other frequencies. It should be appreciated that the frequencies which constitute "low" frequencies in this example may be defined in any suitable fashion.

In some embodiments, the introduction of one or more digital filters in act 404, and/or the modification of the amplitude and/or frequency at which one or more digital filters is applied in act 406, may be governed by one or more rules. For example, a rule may provide a maximum extent to which a predefined template may be modified in acts 404 and/or 406, such as to preserve the fundamental character of a particular sound source with which the template is associated. As another example, a rule may specify that if the average power of a track in a particular frequency range over a particular time period exceeds a particular threshold, then at least one digital filter is to be applied. Any suitable rule(s) may govern the automatic performance of sound equalization to an audio track, in any suitable way.

Example 2: Automatically Performing Audio Compression

In some embodiments of the invention, act 112 may involve automatically performing audio compression. In this respect, compression is an audio production technique in which loud sounds are attenuated, to an extent determined by one or more compression parameters. One of these parameters is the compression threshold, which is the gain level which a track must exceed in a frequency range to be attenuated. Another parameter is the compression ratio, which defines the extent to which sound that exceeds the compression threshold is attenuated. For example, if a 2:1 compression ratio is used, then sounds above the compression threshold be attenuated by a factor of 2.

Figure 5:
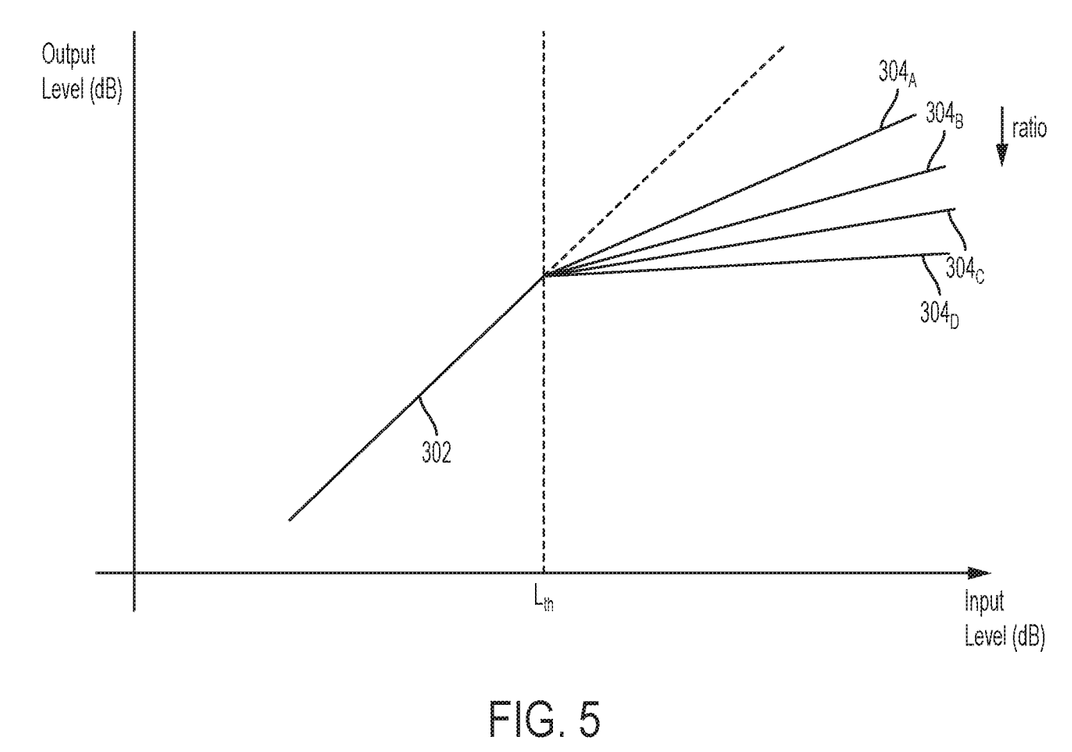
FIG. 5 is a plot depicting representative functions for audio compression, according to some embodiments of the invention.

FIG. 5 depicts how the level of a track is modified if different compression ratios are applied. FIG. 5 includes two regions, separated by the compression threshold $L_{th}$. Below the compression threshold (i.e., to the left of $L_{th}$ in FIG. 5), the ratio of the increase in the gain output level of the track to the increase in the gain input level of the track is roughly 1:1 (as indicated by curve 302), as no compression is applied. When the input level exceeds the compression threshold $L_{th}$, however, compression is performed, and the ratio of the increase in the gain output level of the track to the increase in the gain input level of the track is less than 1:1, as compression is applied and the dynamic range of the track is decreased. The extent to which the gain output level is compressed depends on the compression ratio. The curves labeled $304_A$, $304_B$, $304_C$, and $304_D$ represent four successively higher compression ratios being applied. For example, curve $304_A$ may be associated with a 2:1 compression ratio, curve $304_B$ may be associated with a 5:1 compression ratio, curve $304_C$ may be associated with a 10:1 compression ratio, and curve $304_D$ may be associated with a $\infty$:1 compression ratio (so that a compressor which applies compression corresponding to curve $304_D$ behaves essentially as a limiter).

Other parameters often used in audio compression include the attack time and release time. The attack time is the period which starts when compression is applied and ends when the compression ratio is reached. The release time is the period which starts when the audio level falls below the compression threshold and ends when the ratio between the output level and input level of the signal is 1:1.

The Assignee has appreciated that while compression may improve sound clarity, suppress background noise, reduce sibilance, and/or boost low sounds without affecting others, it can also negatively affect the quality of a mix if not applied judiciously. The Assignee has also appreciated that tuning compression parameters to produce pleasing audio can be cumbersome and time-consuming, as it often involves multiple trial-and-error iterations before a satisfying output is produced. As an example, tuning the attack time parameter often involves finding the right balance between the duration of a drum kick sound and that of a guitar sound. Selecting too long an attack time may result in an overly extended guitar sound, and selecting too short an attack time can "choke" the sound produced by the kick drum.

Some embodiments of the invention, then, are directed to automatically applying compression to a track or multi-track mix. The application of compression may involve tuning one or more compression parameters based at least in part on the spectral content and/or dynamic characteristics of the track or mix, so as to produce clear and balanced audio without affecting its character. For example, in some embodiments, the compression threshold and/or compression ratio may be automatically set based upon one or more characteristics of peaks in the track or mix, such as the presence, amplitude, duration, and/or regularity of peaks. In some embodiments, the compression threshold and/or compression ratio may be automatically set based at least in part upon the spectral bandwidth(s) in which peaks occur in a track or mix. In some embodiments, the compression threshold and/or compression ratio may be automatically set based at least in part upon the ratio between the power associated with one or more peaks and the average power of the track or mix, or between the power associated with one or more peaks and the average power of portions of the track or mix which do not include the peak(s). Any suitable information, which may or may not relate to peaks, may be used to automatically set the compression threshold and/or compression ratio for a track or mix.

In some embodiments, the attack time and/or release time may be automatically set based at least in part upon one or more dynamic characteristics of a track or mix, such as the duration and/or amplitude of "tails" generated by a particular sound source (e.g., a kick drum hit, a guitar strum, etc.), the ratio between the durations and/or amplitudes of tails generated by different sound sources, and/or the frequency of tails (e.g., how many occur in a given predetermined time interval). As with the compression threshold and compression ratio discussed above, any suitable information (which may or may not relate to tails generated by a sound source) may be used to automatically set an attack time and/or release time for a track or mix.

In some embodiments, the manner in which compression is automatically applied may be governed by one or more rules. For example, a rule may provide specify admissible ranges for a compression threshold, compression ratio, attack time and/or and release time, to ensure that compression which is automatically applied does not alter the fundamental character of a track or mix. Any suitable rule(s) may govern the automatic application of compression to a track or mix, in any suitable way.

Example 3: Automatically Positioning Cross-Overs

Figure 6:
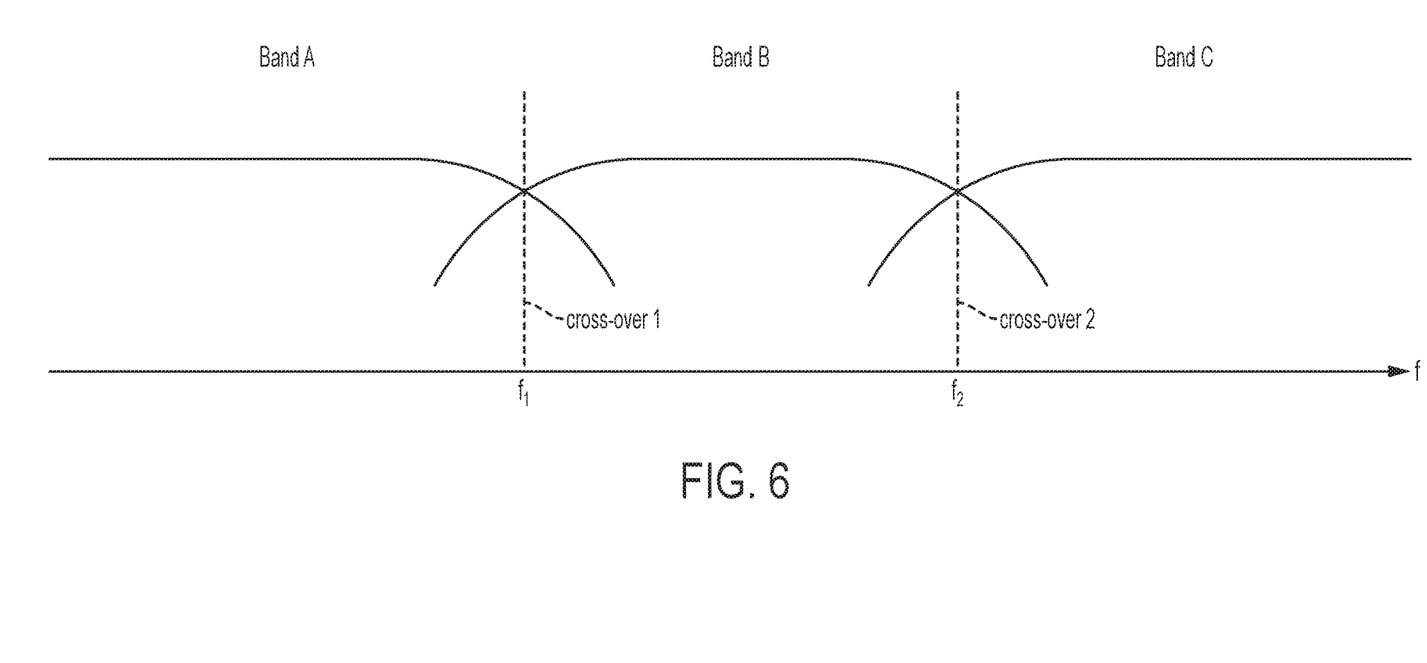
FIG. 6 is a plot depicting representative cross-overs and frequency bands, according to some embodiments of the invention.

In some embodiments of the invention, act 112 may involve automatically specifying one or more cross-overs. In this respect, a cross-over is defined so as to delimit a portion of the frequency spectrum so that different frequency bands may have compression applied differently. FIG. 6 shows a frequency spectrum which is segmented using cross-overs. In the example shown, two cross-overs are applied, at frequencies $f_1$ and $f_2$, thus creating three bands (i.e., bands A, B and C) in which compression may be applied differently. Applying compression differently in different frequency bands is known as multi-band compression, and may be performed when performing single-band compression tends to negatively affect the relationships between different sounds in a track or mix.

The Assignee has appreciated that improperly positioning cross-overs across the frequency spectrum can have significant negative effects on a track or mix, such as by introducing excess noise, ringing and/or distortion. The Assignee has also appreciated, however, that determining where to place cross-overs is a complex task which often involves time-consuming trial-and-error. As such, some embodiments of the present invention are directed to automatically determining the manner in which multi-band compression is applied. This determination may, for example, be based at least in part upon the spectral and/or dynamic characteristics of a track or mix.

For example, the position and number of cross-overs, and the compression threshold and/or ratio to be applied in each of multiple frequency bands, may be automatically identified so as to balance the level of a track across the entire frequency spectrum. For example, if frequent and large peaks occur within a particular frequency range, then a cross-over may be positioned so as to isolate these peaks, and compression within the isolated area may employ a low compression threshold and/or high compression ratio.

As another example, the position and number of cross-overs, and the attack time and release time to be applied in each of multiple frequency bands, may be automatically identified so as to balance the duration of sounds across the frequency spectrum. For example, if high-frequency sounds tend to exhibit long tails and low-frequency sounds tend to exhibit short tails, then one or more cross-overs may be positioned to isolate the bands in which the short and long tails tend to occur, the attack time in the low-frequency band may be increased, and the attack time in the high-frequency band may be decreased.

In some embodiments, the manner in which multi-band compression is automatically applied may be governed by one or more rules. For example, a rule may provide a minimum and/or maximum number of cross-overs that may be applied to a track or mix. Any suitable rule(s) may govern the automatic application of multi-band compression to a track or mix, in any suitable way.

In some embodiments, the manner in which different audio production operations are applied may be governed by one or more rules. For example, a rule may provide a sequence in which certain production operations are performed, such as to specify that automatic sound equalization is to be performed before automatic compression. Any suitable rule(s) may govern the performance of different audio production operations, in any suitable way.

Referring again to FIG. 1, at the completion of act 112, representative process 100 proceeds to act 114, wherein a user is allowed to modify any of the settings applied in act 106 and/or act 110. In this respect, the Assignee has appreciated that audio production is ultimately a creative task in which a user seeks to express a particular perspective, convey a particular emotion, create a particular mood, etc. While some embodiments of the invention may provide features designed to improve the overall efficiency of the audio production process, and may enhance the quality of the output of that process, some embodiments may also provide features designed to ensure that the user's creativity is not abridged.

At the completion of act 114, representative process 100 completes.

It should be appreciated that settings which are automatically determined for a track or mix may evolve over time. For example, the settings which are automatically determined for a given track at a first time may be different than the settings which are automatically determined for the track at a second time. Any differences in the way that settings are automatically determined over time may, for example, be the result of analyzing how one or more users employ an audio production tool providing the functionality described herein, how one or more users modifies one or more settings subsequent to the setting(s) being automatically determined, and/or based upon any other suitable information. For example, one or more machine learning algorithms may process information on user habits over time to change the way in which certain settings are automatically determined.

It should also be appreciated that various embodiments of the invention may vary from the specific techniques and processes described above, in any of numerous ways, without departing from the spirit and scope of the invention. Using representative process 100 as an illustrative example, certain embodiments of the invention may omit some of the acts described above with reference to FIG. 1, may include additional acts not described above with reference to FIG. 1, and/or may involve performing acts in a different order than that which is described above with reference to FIG. 1. As an example, some embodiments may involve automatically determining one or more settings for a track (as described above with reference to act 112 in FIG. 1) without applying a predefined template associated with one or more sound sources included in the track (as described above with reference to act 106 in FIG. 1).

III. Implementation Detail

Figure 7:
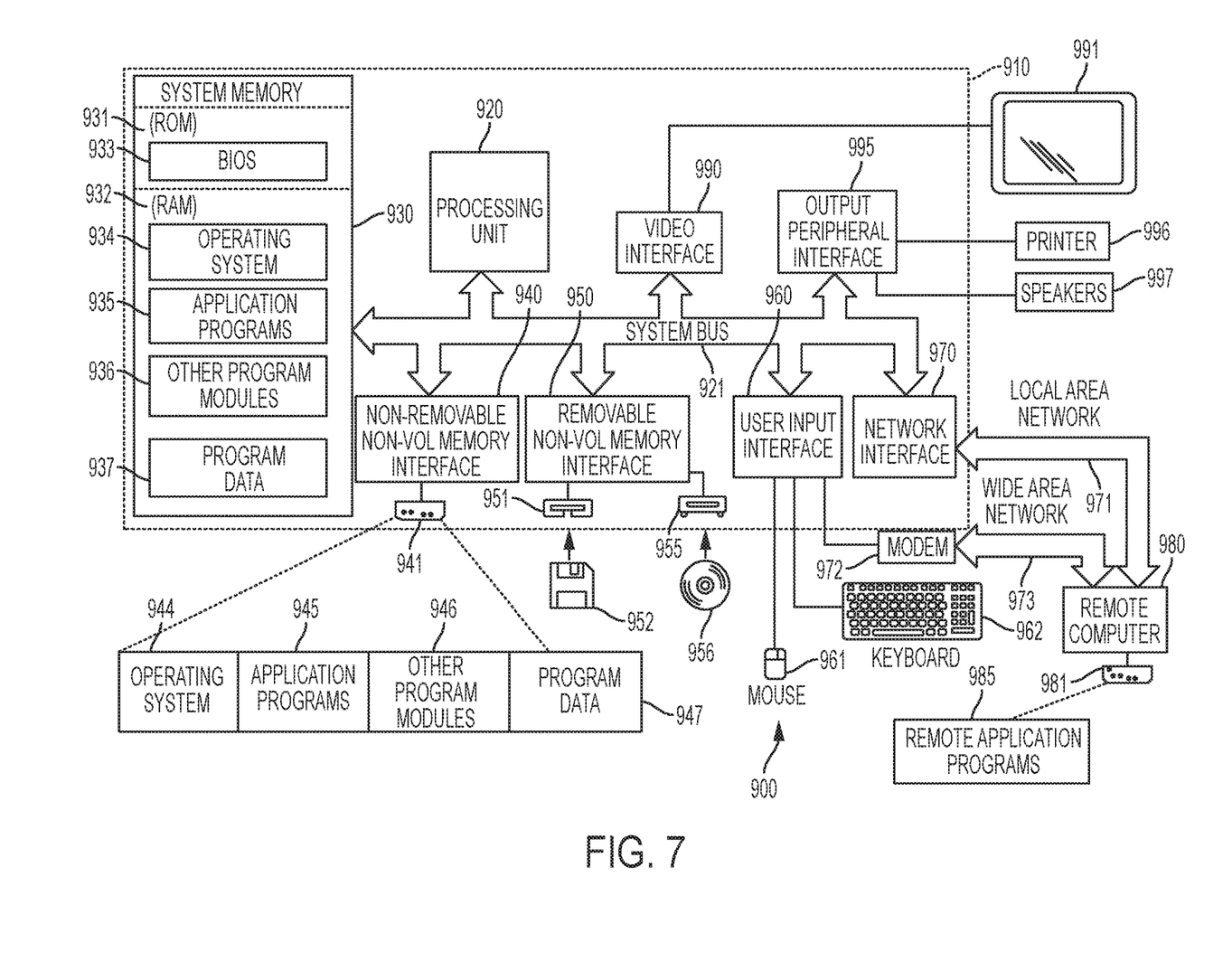
FIG. 7 is a block diagram illustrating a representative computer system which may be used to implement certain aspects of the invention.

It should be appreciated from the foregoing that some embodiments of the invention may employ a computing device. For example, representative process 100 may be performed via execution of software by such a computing device. FIG. 7 depicts a general purpose computing device, in the form of computer 910, which may be used to implement certain aspects of the invention.

In computer 910, components include, but are not limited to, a processing unit 920, a system memory 930, and a system bus 921 that couples various system components including the system memory to the processing unit 920. The system bus 921 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 910 typically includes a variety of computer readable media. Computer readable media can be any available media that can be accessed by computer 910 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media include, but are not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other one or more media which may be used to store the desired information and may be accessed by computer 910. Communication media typically embody computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared and other wireless media. Combinations of the any of the above should also be included within the scope of computer readable media.

The system memory 930 includes computer storage media in the form of volatile and/or nonvolatile memory such as read only memory (ROM) 931 and random access memory (RAM) 932. A basic input/output system 933 (BIOS), containing the basic routines that help to transfer information between elements within computer 910, such as during start-up, is typically stored in ROM 931. RAM 932 typically contains data and/or program modules that are immediately accessible to and/or presently being operated on by processing unit 920. By way of example, and not limitation, FIG. 7 illustrates operating system 934, application programs 935, other program modules 939, and program data 937.

The computer 910 may also include other removable/non-removable, volatile/nonvolatile computer storage media. By way of example only, FIG. 7 illustrates a hard disk drive 941 that reads from or writes to non-removable, nonvolatile magnetic media, a magnetic disk drive 951 that reads from or writes to a removable, nonvolatile magnetic disk 952, and an optical disk drive 955 that reads from or writes to a removable, nonvolatile optical disk 959 such as a CD ROM or other optical media. Other removable/non-removable, volatile/nonvolatile computer storage media that can be used in the exemplary computing system include, but are not limited to, magnetic tape cassettes, flash memory cards, digital versatile disks, digital video tape, solid state RAM, solid state ROM, and the like. The hard disk drive 941 is typically connected to the system bus 921 through an non-removable memory interface such as interface 940, and magnetic disk drive 951 and optical disk drive 955 are typically connected to the system bus 921 by a removable memory interface, such as interface 950.

The drives and their associated computer storage media discussed above and illustrated in FIG. 7, provide storage of computer readable instructions, data structures, program modules and other data for the computer 910. In FIG. 7, for example, hard disk drive 941 is illustrated as storing operating system 944, application programs 945, other program modules 949, and program data 947. Note that these components can either be the same as or different from operating system 934, application programs 935, other program modules 539, and program data 937. Operating system 944, application programs 945, other program modules 949, and program data 947 are given different numbers here to illustrate that, at a minimum, they are different copies. A user may enter commands and information into the computer 910 through input devices such as a keyboard 992 and pointing device 991, commonly referred to as a mouse, trackball or touch pad. Other input devices (not shown) may include a microphone, joystick, game pad, satellite dish, scanner, or the like. These and other input devices are often connected to the processing unit 920 through a user input interface 590 that is coupled to the system bus, but may be connected by other interface and bus structures, such as a parallel port, game port or a universal serial bus (USB). A monitor 991 or other type of display device is also connected to the system bus 921 via an interface, such as a video interface 990. In addition to the monitor, computers may also include other peripheral output devices such as speakers 997 and printer 999, which may be connected through a output peripheral interface 995.

The computer 910 may operate in a networked environment using logical connections to one or more remote computers, such as a remote computer 980. The remote computer 980 may be a personal computer, a server, a router, a network PC, a peer device or other common network node, and typically includes many or all of the elements described above relative to the computer 910, although only a memory storage device 981 has been illustrated in FIG. 7. The logical connections depicted in FIG. 7 include a local area network (LAN) 971 and a wide area network (WAN) 973, but may also include other networks. Such networking environments are commonplace in offices, enterprise-wide computer networks, intranets and the Internet.

When used in a LAN networking environment, the computer 910 is connected to the LAN 971 through a network interface or adapter 970. When used in a WAN networking environment, the computer 910 typically includes a modem 972 or other means for establishing communications over the WAN 973, such as the Internet. The modem 972, which may be internal or external, may be connected to the system bus 921 via the user input interface 990, or other appropriate mechanism. In a networked environment, program modules depicted relative to the computer 910, or portions thereof, may be stored in the remote memory storage device. By way of example, and not limitation, FIG. 7 illustrates remote application programs 985 as residing on memory device 981. It will be appreciated that the network connections shown are exemplary and other means of establishing a communications link between the computers may be used.

Embodiments of the invention may be embodied as a computer readable storage medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the invention discussed above. As is apparent from the foregoing examples, a computer readable storage medium may retain information for a sufficient time to provide computer-executable instructions in a non-transitory form. Such a computer readable storage medium or media can be transportable, such that the program or programs stored thereon can be loaded onto one or more different computers or other processors to implement various aspects of the present invention as discussed above. As used herein, the term "computer-readable storage medium" encompasses only a tangible machine, mechanism or device from which a computer may read information. Alternatively or additionally, the invention may be embodied as a computer readable medium other than a computer-readable storage medium. Examples of computer readable media which are not computer readable storage media include transitory media, like propagating signals.

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Various aspects of the present invention may be used alone, in combination, or in a variety of arrangements not specifically discussed in the embodiments described in the foregoing, and it is, therefore, not limited in its application to the details and arrangement of components set forth in the foregoing description or illustrated in the drawings. For example, aspects described in one embodiment may be combined in any manner with aspects described in other embodiments.

The invention may be embodied as a method, of which various examples have been described. The acts performed as part of the method may be ordered in any suitable way. Accordingly, embodiments may be constructed in which acts are performed in an order different than illustrated, which may include different (e.g., more or less) acts than those which are described, and/or which may involve performing some acts simultaneously, even though the acts are shown as being performed sequentially in the embodiments specifically described above.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The invention claimed is:

1. A method for enhancing an audio recording, the method being for use in a system comprising at least one computer processor, the method comprising acts of:
   (A) automatically identifying, using the at least one computer processor, a sound source in the audio recording;
   (B) automatically determining, using the at least one computer processor, a plurality of settings for the audio recording based at least in part upon the sound source identified in the act (A);
   (C) upon automatically determining the plurality of settings in the act (B), automatically determining, using the at least one computer processor, at least one spectral or dynamic characteristic of the audio recording;
   (D) automatically modifying, using the at least one computer processor, at least one of the plurality of settings determined in the act (B) based at least in part upon the spectral or dynamic characteristic(s) determined in the act (C);
   (E) receiving input from a user to adjust a setting modified in the act (D); and
   (F) causing playback of the audio recording employing the setting adjusted in the act (E);
wherein the act (C) comprises automatically determining a frequency range in which power level peaks at a predefined amplitude and/or incidence rate occur, the frequency range having an upper limit and a lower limit, and the act (D) comprises automatically positioning a cross-over at the upper limit or lower limit of the frequency range, and applying a different compression threshold and/or compression ratio within the frequency range than is applied to the audio recording outside the frequency range.

2. The method of claim 1, wherein the audio recording constitutes a track of a multi-track audio recording.

3. The method of claim 1, wherein:
   the act (C) comprises automatically determining at least one spectral or dynamic characteristic comprising one or more of: a frequency range in which the audio recording exceeds or is below a threshold power level, a relationship between a power level of the audio recording in one frequency range and the power level of the audio recording in another frequency range, and a presence, amplitude, duration or regularity of a peak power level of the audio recording; and
   the act (D) comprises automatically performing sound equalization of the audio recording based at least in part upon the determined at least one spectral or dynamic characteristic.

4. The method of claim 1, wherein the act (C) comprises comparing the spectral or dynamic characteristic(s) of the audio recording to a model to identify a frequency range in which the spectral or dynamic characteristic(s) of the audio recording vary(ies) from the model, and the act (D) comprises applying one or more digital filters to the audio recording in the frequency range.

5. The method of claim 1, wherein the act (C) comprises comparing the spectral or dynamic characteristic(s) of the audio recording to a model having a lower frequency limit and an upper frequency limit, and the act (D) comprises applying one or more digital filters to the audio recording at a frequency below the lower frequency limit of the spectral model or above the upper frequency limit of the spectral model.

6. The method of claim 1, wherein the act (D) comprises automatically applying one or more digital filters to boost a power level of the audio recording in a first frequency range and applying one or more digital filters to attenuate a power level of the audio recording in a second frequency range, so as to approximate a target ratio between the power level of the audio recording in the first frequency range and the power level of the audio recording in the second frequency range.

7. The method of claim 6, wherein the target ratio is defined based at least in part upon the sound source identified in the act (A).

8. The method of claim 1, wherein the act (D) comprises automatically applying a plurality of digital filters, at least one of the plurality of digital filters attenuating a power level of the audio recording in a first frequency range and at least one other of the plurality of digital filters boosting a power level of the audio recording in a second frequency range.

9. The method of claim 8, wherein the first frequency range is predefined as a high frequency range, and the second frequency range is predefined as a middle frequency range.

10. The method of claim 8, wherein the second frequency range is predefined as a low frequency range, and the first frequency range is a frequency range other than the second frequency range.

11. The method of claim 1, wherein the act (D) comprises automatically determining a frequency and amplitude for at least one digital filter applied to the audio recording based at least in part upon a sound system apparatus on which playback of the audio recording is to occur.

12. The method of claim 1, wherein:
   the act (C) comprises automatically determining a spectral or dynamic characteristic comprising at least one of: a presence, amplitude, duration or regularity of one or more power level peaks in the audio recording; a frequency range in which one or more power level peaks occur in the audio recording; a ratio between a power level of one or more power level peaks and an average power level of the audio recording; a ratio between a power level of one or more power level peaks and an average power level of a portion of the audio recording which does not include the one or more power level peaks; and a duration or power level of sound generated by the sound source identified in the act (A); and the act (D) comprises automatically applying at least one of a compression threshold, a compression ratio, a compression attack time, and a compression release time to the audio recording based at least in part upon the spectral characteristic(s) determined in the act (C).

13. The method of claim 12, wherein the act (D) comprises automatically applying the at least one of the compression threshold, compression ratio, compression attack time and compression release time within a predefined frequency range.

14. The method of claim 1, comprising an act, performed prior to the act (A), comprising receiving a plurality of audio recordings, each of the plurality of audio recordings constituting a track of a multi-track audio recording; and wherein the acts (A)-(F) are performed for each of the plurality of audio recordings.

15. An apparatus for enhancing an audio recording, the apparatus comprising:

at least one computer-readable storage medium, having instructions stored thereon; and at least one computer processor, programmed via the instructions to:

automatically identify a sound source in the audio recording;

automatically determine a plurality of settings for the audio recording based at least in part upon the identified sound source;

upon automatically determining the plurality of settings, automatically determine at least one spectral or dynamic characteristic of the audio recording;

automatically modify at least one of the plurality of settings based at least in part upon the determined spectral or dynamic characteristic(s);

receive input from a user to adjust a modified setting; and cause playback of the audio recording employing the adjusted setting, wherein the at least one computer processor is programmed to automatically identify a frequency range in which power level peaks at a predefined amplitude and/or incidence rate occur, the frequency range having an upper limit and a lower limit, automatically position a cross-over at the upper limit or lower limit of the frequency range, and apply a different compression threshold and/or compression ratio within the frequency range than is applied to the audio recording outside the frequency range.

16. The apparatus of claim 15, wherein the at least one computer processor is programmed to receive a plurality of audio recordings, each of the plurality of audio recordings constituting a track of a multi-track audio recording.

17. The apparatus of claim 15, wherein the at least one computer processor is programmed to:

automatically determine at least one spectral or dynamic characteristic comprising one or more of: a frequency range in which the audio recording exceeds or is below a threshold power level, a relationship between a power level of the audio recording in one frequency range and the power level of the audio recording in another frequency range, and a presence, amplitude, duration or regularity of a peak power level of the audio recording; and automatically perform sound equalization of the audio recording based at least in part upon the determined at least one spectral or dynamic characteristic.

18. The apparatus of claim 15, wherein the at least one computer processor is programmed to compare the spectral or dynamic characteristic(s) of the audio recording to a model to identify a frequency range in which the spectral or dynamic characteristic(s) of the audio recording vary(ies) from the model, and to apply one or more digital filters to the audio recording in the frequency range.

19. The apparatus of claim 15, wherein the at least one computer processor is programmed to compare the spectral or dynamic characteristic(s) of the audio recording to a model having a lower frequency limit and an upper frequency limit, and to apply one or more digital filters to the audio recording at a frequency below the lower frequency limit of the spectral model or above the upper frequency limit of the spectral model.

20. The apparatus of claim 15, wherein the at least one computer processor is programmed to automatically apply one or more digital filters to boost a power level of the audio recording in a first frequency range and applying one or more digital filters to attenuate a power level of the audio recording in a second frequency range, so as to approximate a target ratio between the power level of the audio recording in the first frequency range and the power level of the audio recording in the second frequency range.

21. The apparatus of claim 20, wherein the target ratio is defined based at least in part upon the identified sound source.

22. The apparatus of claim 15, wherein the at least one computer processor is programmed to automatically apply a plurality of digital filters, at least one of the plurality of digital filters attenuating a power level of the audio recording in a first frequency range and at least one other of the plurality of digital filters boosting a power level of the audio recording in a second frequency range.

23. The apparatus of claim 22, wherein the first frequency range is predefined as a high frequency range, and the second frequency range is predefined as a middle frequency range.

24. The apparatus of claim 22, wherein the second frequency range is predefined as a low frequency range, and the first frequency range is a frequency range other than the second frequency range.

25. The apparatus of claim 15, wherein the at least one computer processor is programmed to automatically determine a frequency and amplitude for at least one digital filter applied to the audio recording based at least in part upon a sound system apparatus on which playback of the audio recording is to occur.

26. The apparatus of claim 15, wherein the at least one computer processor is programmed to:

automatically determine a spectral or dynamic characteristic comprising at least one of: a presence, amplitude, duration or regularity of one or more power level peaks in the audio recording; a frequency range in which one or more power level peaks occur in the audio recording; a ratio between a power level of one or more power level peaks and an average power level of the audio recording; a ratio between a power level of one or more power level peaks and an average power level of a portion of the audio recording which does not include the one or more power level peaks; and a duration or power level of sound generated by the identified sound source; and automatically apply at least one of a compression threshold, a compression ratio, a compression attack time, and a compression release time to the audio recording based at least in part upon the determined at least one spectral characteristic.

27. The apparatus of claim 26, wherein the at least one computer processor is programmed to automatically apply the at least one of the compression threshold, compression ratio, compression attack time and compression release time within a predefined frequency range.

28. At least one computer-readable storage medium having instructions encoded thereon which, when executed in a computer system, cause the computer system to perform a method for enhancing an audio recording, the method comprising acts of:

(A) automatically identifying, using the at least one computer processor, a sound source in the audio recording;

(B) automatically determining, using the at least one computer processor, a plurality of settings for the audio recording based at least in part upon the sound source identified in the act (A);

(C) upon automatically determining the plurality of settings in the act (B), automatically determining, using the at least one computer processor, at least one spectral or dynamic characteristic of the audio recording;

(D) automatically modifying, using the at least one computer processor, at least one of the plurality of settings determined in the act (B) based at least in part upon the spectral or dynamic characteristic(s) determined in the act (C);

(E) receiving input from a user to adjust a setting modified in the act (D); and (F) causing playback of the audio recording employing the setting adjusted in the act (E);

wherein the act (C) comprises automatically determining a frequency range in which power level peaks at a predefined amplitude and/or incidence rate occur, the frequency range having an upper limit and a lower limit, and the act (D) comprises automatically positioning a cross-over at the upper limit or lower limit of the frequency range, and applying a different compression threshold and/or compression ratio within the frequency range than is applied to the audio recording outside the frequency range.

* * * * *